(12) United States Patent
Lo et al.

(10) Patent No.: US 11,402,412 B2
(45) Date of Patent: Aug. 2, 2022

(54) CURRENT SENSOR

(71) Applicant: TDK Corporation, Tokyo (JP)

(72) Inventors: Adrian Lo, Tokyo (JP); Masafumi Kami, Tokyo (JP); Jun Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/065,853

(22) Filed: Oct. 8, 2020

(65) Prior Publication Data

US 2021/0172982 A1 Jun. 10, 2021

(30) Foreign Application Priority Data

Dec. 6, 2019 (JP) .............................. JP2019-220874

(51) Int. Cl.
*G01R 19/15* (2006.01)
*G01R 15/20* (2006.01)

(52) U.S. Cl.
CPC ........... *G01R 19/15* (2013.01); *G01R 15/202* (2013.01); *G01R 15/207* (2013.01)

(58) Field of Classification Search
CPC .. G01R 19/0092; G01R 19/15; G01R 15/202; G01R 15/205; G01R 15/04; G01R 15/185
See application file for complete search history.

(56) References Cited

U.S. PATENT DOCUMENTS

| | | | |
|---|---|---|---|
| 5,066,904 A | 11/1991 | Bullock | |
| 2002/0153886 A1* | 10/2002 | Kawakami | G01R 33/04 324/253 |
| 2005/0156587 A1* | 7/2005 | Yakymyshyn | G01R 15/207 324/117 R |
| 2010/0289489 A1* | 11/2010 | Tadatsu | G01R 15/185 324/258 |
| 2013/0154629 A1* | 6/2013 | Gudel | G01R 33/04 324/225 |

(Continued)

FOREIGN PATENT DOCUMENTS

| | | | | |
|---|---|---|---|---|
| CN | 103547931 A | * | 1/2014 | ........... G01R 15/207 |
| CN | 106093524 A | * | 11/2016 | ........... G01R 15/148 |

(Continued)

OTHER PUBLICATIONS

Extended European Search Report issued in corresponding European Patent Application No. 20211090.4-1010, dated Apr. 15, 2021.

*Primary Examiner* — Patrick Assouad
*Assistant Examiner* — Demetrius R Pretlow
(74) *Attorney, Agent, or Firm* — McDermott Will & Emery LLP

(57) ABSTRACT

Disclosed herein is a current sensor that includes a bus bar and a magnetic sensor. The bus bar includes first and second cylindrical structure parts which are coaxially arranged, and a sensing part disposed in a hollow area surrounded by the first and second cylindrical structure parts. The magnetic sensor is disposed in the hollow area. The bus bar is configured to branch current to be measured into the first cylindrical structure part and sensing part and to make at least part of a current component of the current to be measured that flows in the first cylindrical structure part in one direction flow in the second cylindrical structure part in an opposite direction to the one direction.

2 Claims, 6 Drawing Sheets

(56) References Cited

U.S. PATENT DOCUMENTS

| | | | |
|---|---|---|---|
| 2013/0241534 A1* | 9/2013 | Schaerrer | G01R 15/202 |
| | | | 324/117 H |
| 2014/0300350 A1* | 10/2014 | Teppan | H01F 38/30 |
| | | | 324/244 |
| 2015/0115938 A1* | 4/2015 | Kasajima | G01R 33/0041 |
| | | | 324/207.18 |
| 2015/0301088 A1* | 10/2015 | Soneda | G01R 1/22 |
| | | | 324/126 |
| 2015/0355241 A1 | 12/2015 | Kawanami | |
| 2018/0120357 A1* | 5/2018 | Takenaka | G01R 15/20 |
| 2020/0300894 A1* | 9/2020 | Brusius | G01R 19/0092 |
| 2020/0379017 A1* | 12/2020 | Claeys | G01R 33/0017 |

FOREIGN PATENT DOCUMENTS

| | | | | |
|---|---|---|---|---|
| DE | 102015009603 B4 * | 5/2019 | | G01R 15/148 |
| EP | 1028321 A2 * | 8/2000 | | G01R 15/04 |
| GB | 2370363 A * | 6/2002 | | G01R 15/183 |
| JP | 2015125020 A * | 7/2015 | | G01R 19/0092 |
| JP | 5971398 B2 | 8/2016 | | |
| JP | 6471826 B1 | 2/2019 | | |
| KR | 20110017774 A * | 2/2011 | | G01R 15/207 |
| WO | 2017/018306 A1 | 2/2017 | | |

* cited by examiner

CURRENT SENSOR

BACKGROUND OF THE INVENTION

Field of the Invention

The present invention relates to a current sensor and, more particularly, to a current sensor using a magnetic sensor.

Description of Related Art

As a current sensor using a magnetic sensor, there are known current sensors described in Japanese Patent No. 5971398 and in International Publication WO 2017/018306. Japanese Patent No. 5971398 discloses a current sensor having a configuration in which two current paths, along which current to be measured flows in one direction and its opposite direction, respectively, are provided in a bus bar, and a magnetic sensor is disposed between the two current paths. Further, International Publication WO 2017/018306 discloses a current sensor in which a bus bar is branched into two current paths, and magnetic sensors are provided respectively to the two current paths.

However, in the magnetic sensor described in Japanese Patent No. 5971398, a magnetic field generated from one current path and a magnetic field generated from the other current path strengthen each other, so that when the amount of current to be measured is large, the magnetic sensor is saturated. Further, in the current sensor described in International Publication WO 2017/018306, the bus bar is branched into two current paths, so that the strength of the magnetic field to be applied to each magnetic sensor is advantageously reduced to ½. However, also in this case, when the amount of current to be measured is large, the magnetic sensor is easily saturated.

On the other hand, in a current sensor described in Japanese Patent No. 6471826, a bus bar is branched into a sensing part and a bypass part, and a branch flow rate therebetween is designed such that the amount of current is smaller in the sensing part than in the bypass part. This reduces the strength of a magnetic field generated from the sensing part, so that it is possible to prevent the magnetic sensor from being saturated even when the amount of current to be measured is large.

However, when the inductance of the bypass part is large, the responsiveness of the magnetic sensor to a change in the amount of current to be measured deteriorates. In particular, when current to be measured changes into a pulse at short times, measurement error becomes large.

SUMMARY

It is therefore an object of the present invention to provide a current sensor in which a bus bar is branched into a sensing part and a bypass part, capable of reducing the inductance of the bypass part to reduce measurement error.

A current sensor according to the present invention includes a bus bar and a magnetic sensor. The bus bar includes: first and second cylindrical structure parts which are coaxially arranged; and a sensing part disposed in a hollow area surrounded by the first and second cylindrical structure parts. The bus bar is configured to branch current to be measured into the first cylindrical structure part and sensing part and to make at least part of a current component of the current to be measured that flows in the first cylindrical structure part in one direction flow in the second cylindrical structure part in the opposite direction to the one direction. The magnetic sensor is disposed in the hollow area and detects a magnetic field generated by a current component of the current to be measured that flows in the sensing part.

According to the present invention, current flows in the opposite directions in the first and second cylindrical structure parts, so that most of a magnetic field to be radiated outside from the bus bar is eliminated. This significantly reduces the inductance of the bus bar, thereby allowing enhancement of the responsiveness of the magnetic sensor with respect to a change in the current to be measured. Further, the hollow area surrounded by the first and second cylindrical structure parts includes a zero magnetic field area, and the sensing part and magnetic sensor are disposed in this hollow area, so that even when large current flows in the bus bar, the magnetic sensor is not saturated to allow correct measurement.

In the present invention, the second cylindrical structure part may be disposed outside the first cylindrical structure part so as to radially cover the first cylindrical structure part. This facilitates connection between the first cylindrical structure part and sensing part.

In the present invention, one end of the sensing part in the axial direction thereof may be connected to the first cylindrical structure part without being connected to the second cylindrical structure part, and the other end of the sensing part in the axial direction may be connected to both the first and second cylindrical structure parts. Thus, with a simple structure, it is possible to make current flow in the opposite directions in the first and second cylindrical structure parts.

In the present invention, the first and second cylindrical structure parts may be detachably configured. Thus, the bus bar can be easily manufactured.

Thus, according to the present invention, measurement error can be reduced in a current sensor in which a bus bar is branched into a sensing part and a bypass part.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
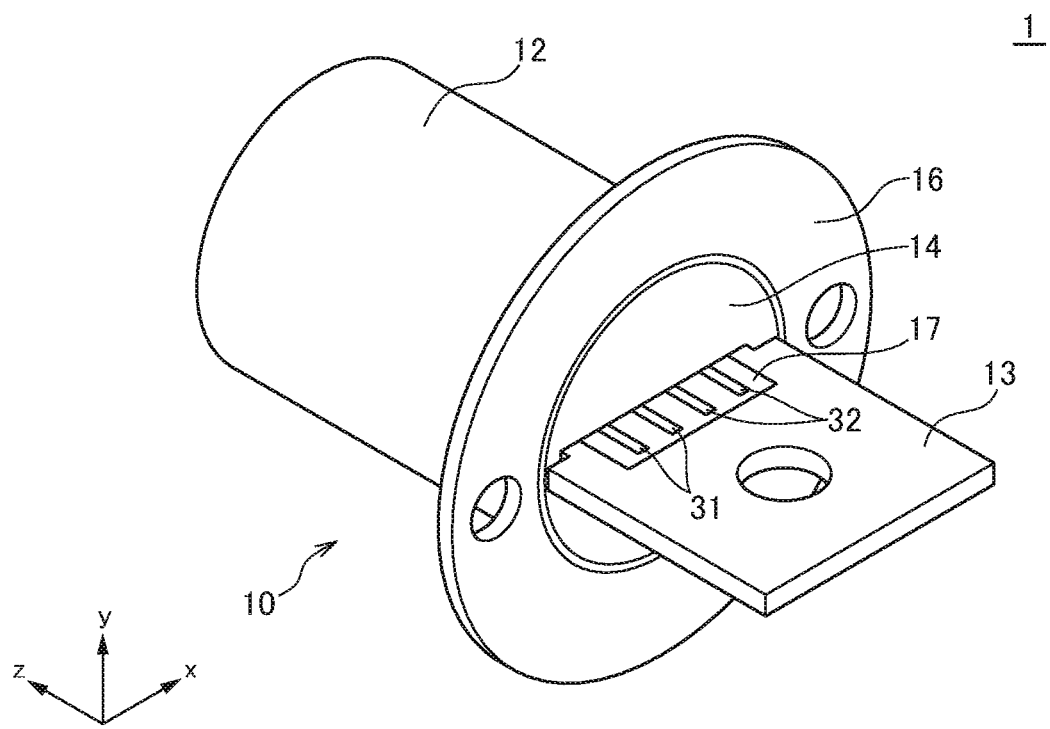
FIGS. 1 and 2 are schematic perspective view illustrating the outer appearance of a current sensor according to an embodiment of the present invention.
Figure 2:
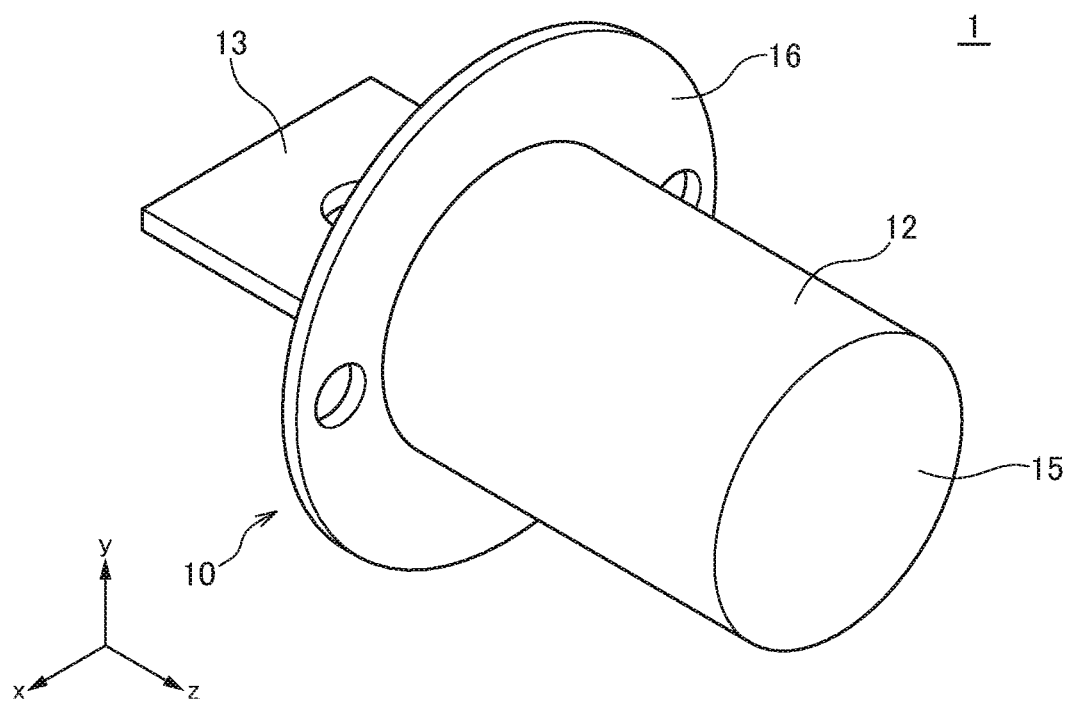
Figure 3:
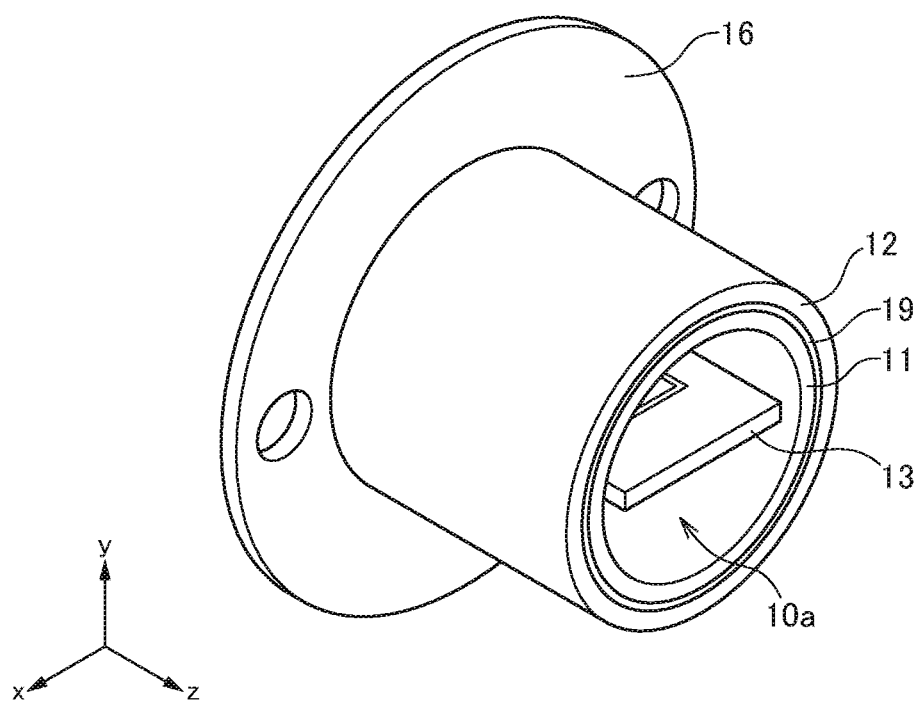
FIG. 3 is a cur model of the current sensor shown in FIGS. 1 and 2.

FIGS. 1 and 2 are schematic perspective view illustrating the outer appearance of a current sensor 1 according to an embodiment of the present invention. FIG. 3 is a cur model of the current sensor 1, and FIG. 4 is an xy cross-sectional view of the current sensor 1.

As illustrated in FIGS. 1 to 4, the current sensor 1 according to the present embodiment has a bus bar 10 in which current I to be measured flows and a magnetic sensor 20. The bus bar 10 is made of a good conductor such as copper or aluminum and includes a double-cylindrical structure made up of cylindrical structure parts 11 and 12 and a sensing part 13 disposed in a hollow area 10a surrounded by the cylindrical structure parts 11 and 12. The cylindrical structure parts 11 and 12 are coaxially arranged with an insulating film 19 interposed therebetween such that the cylindrical structure part 11 is positioned inside and the cylindrical structure part 12 is positioned outside. In other words, the cylindrical structure part 12 is positioned outside the cylindrical structure part 11 through the insulating film 19 so as to radially cover the cylindrical structure part 11. One end of the cylindrical structure part 11 in the z-direction is closed by a plate-like part 14 constituting a part of the bus bar 10. The other ends of the cylindrical structure parts 11 and 12 in the z-direction are closed by a plate-like part 15 constituting a part of the bus bar 10. The sensing part 13 is disposed in the hollow area 10a so as to connect the plate-like parts 14 and 15. With this configuration, one end of the sensing part 13 in the axial direction (z-direction) is connected to the cylindrical structure part 11 without being connected to the cylindrical structure part 12, while the other end of the sensing part 13 in the axial direction is connected to both the cylindrical structure parts 11 and 12.

Figure 4:
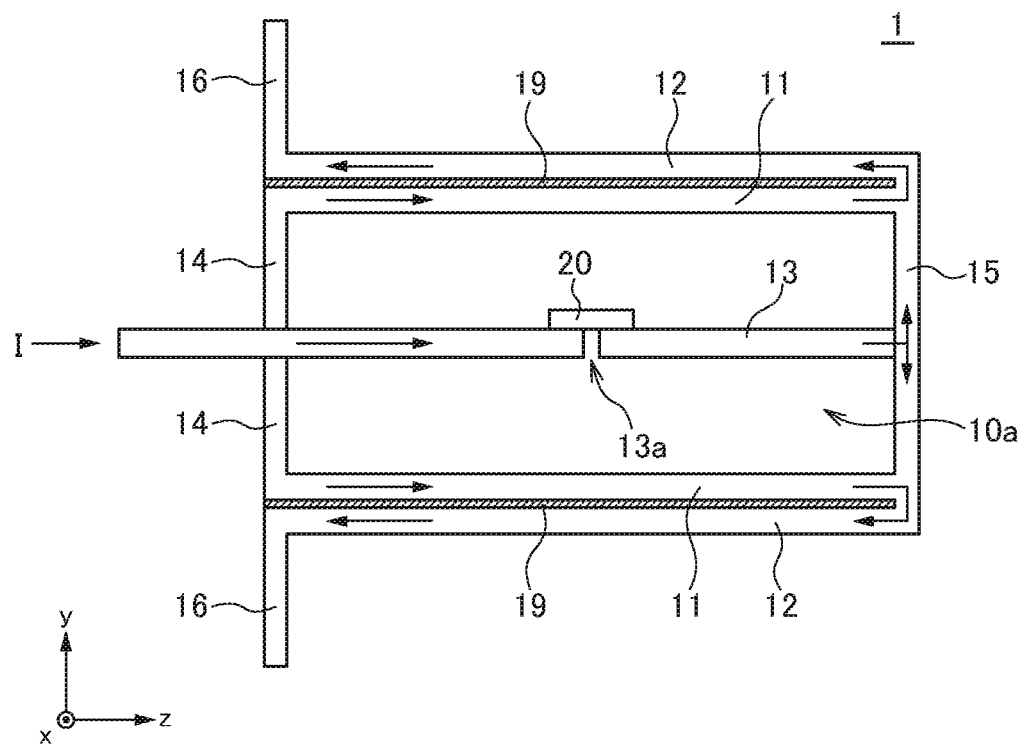
FIG. 4 is an xy cross-sectional view of the current sensor shown in FIGS. 1 and 2.

As illustrated in FIG. 4, when the current I to be measured is made to flow in the bus bar 10, part of the current I to be measured flows in the cylindrical structure part 11 in the positive z-direction, and the remaining part thereof flows in the sensing part 13 in the positive z-direction. In the present embodiment, the sectional area of the cylindrical structure part 11 is sufficiently larger than the sectional area of the sensing part 13, so that, when the current I to be measured is made to flow in the bus bar 10, most of the current I to be measured flows in the cylindrical structure part 11. The current flowing in the cylindrical structure part 11 and current flowing in the sensing part 13 merge at the plate-lie part 15, and the resultant current flows in the cylindrical structure part 12 in the negative z-direction. That is, the directions of the current flowing in the cylindrical structure part 11 and current flowing in the cylindrical structure part 12 are opposite to each other.

Figure 5:
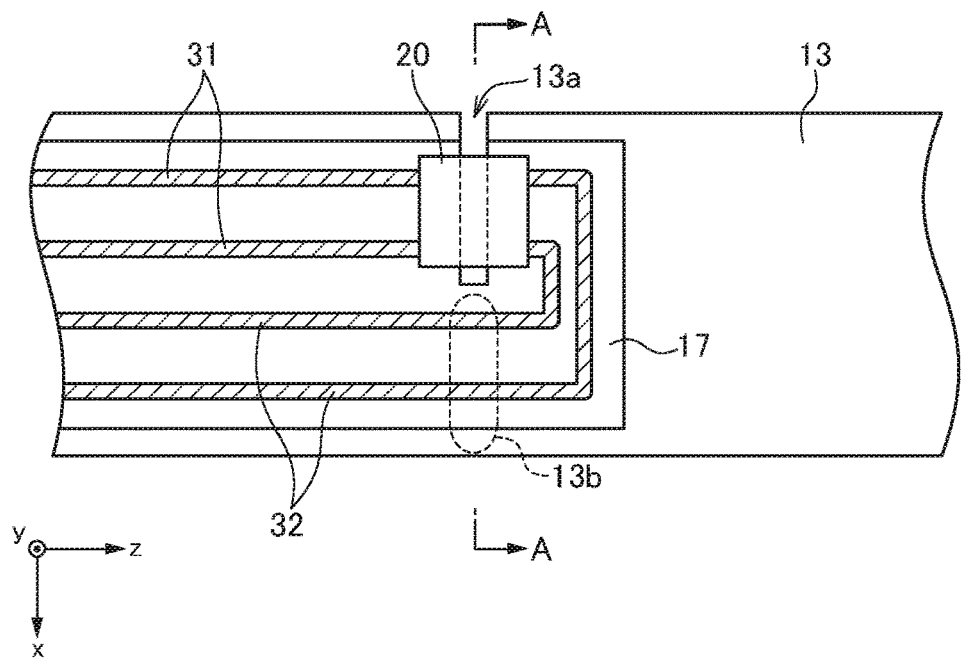
FIG. 5 is a partial plan view of the sensing part.
Figure 6:
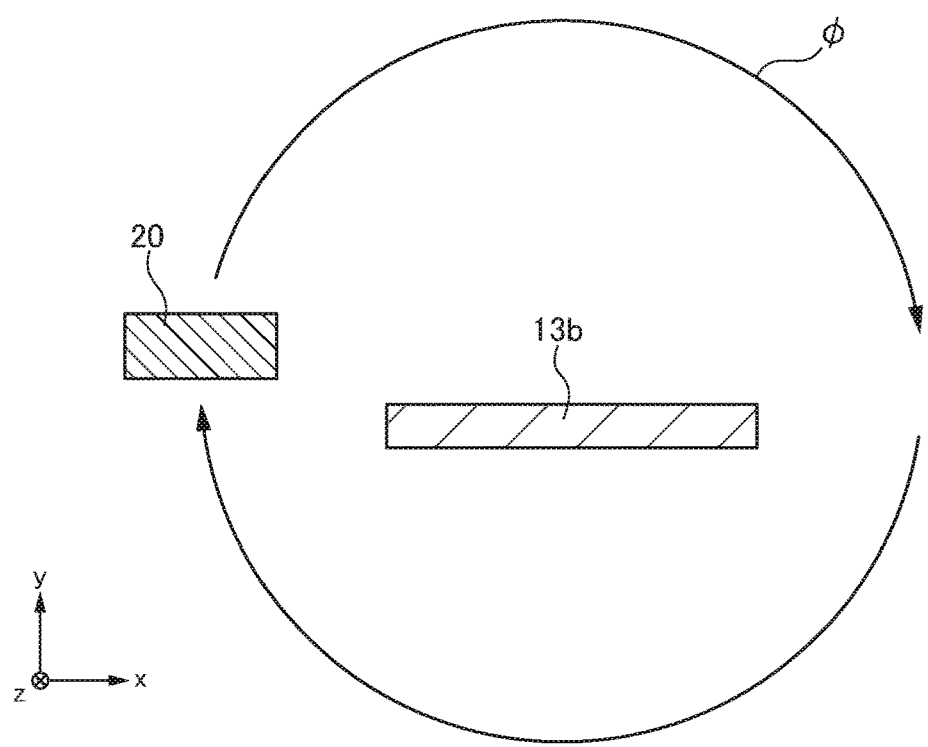
FIG. 6 is a schematic cross-sectional view taken along the line A-A in FIG. 5.

FIG. 5 is a partial plan view of the sensing part 13, and FIG. 6 is a schematic cross-sectional view taken along the line A-A in FIG. 5.

As illustrated in FIGS. 5 and 6, the sensing part 13 has a slit 13a extending in the x-direction, and the magnetic sensor 20 is mounted so as to overlap the slit 13a. The magnetic sensor 20 is not particularly limited in type and may be a Hall element or a magneto-resistive element. The sensing part 13 has thereinside wiring patterns 31 and 32 which are surrounded by an insulating film 17. Both the wiring patterns 31 and 32 are connected to the magnetic sensor 20. For example, the wiring pattern 31 is a wiring for signal transmission, and the wiring pattern 32 is a wiring for power transmission. An output signal from the magnetic sensor 20 is led outside through the wiring pattern 31.

The width of the sensing part 13 in the x-direction is narrowed at a portion at which the slit 13a is formed, and a magnetic field generated by current flowing in this narrow portion 13b is applied to the magnetic sensor 20. Specifically, when part of the current I to be measured flows in the narrow portion 13b in the z-direction, a magnetic field φ is generated around the narrow portion 13b according to the right-handed screw rule. The magnetic field φ has a y-direction component with respect to the magnetic sensor 20, so that, by setting the magnetic sensing direction of the magnetic sensor 20 to the y-direction, it is possible to detect the strength of the magnetic field φ. A signal obtained by detecting the magnetic field φ is led outside through the wiring pattern 31. The ratio of current that flows in the narrow portion 13b to the entire current I to be measured can be adjusted by the width of the slit 13a in the x-direction.

Figure 7:
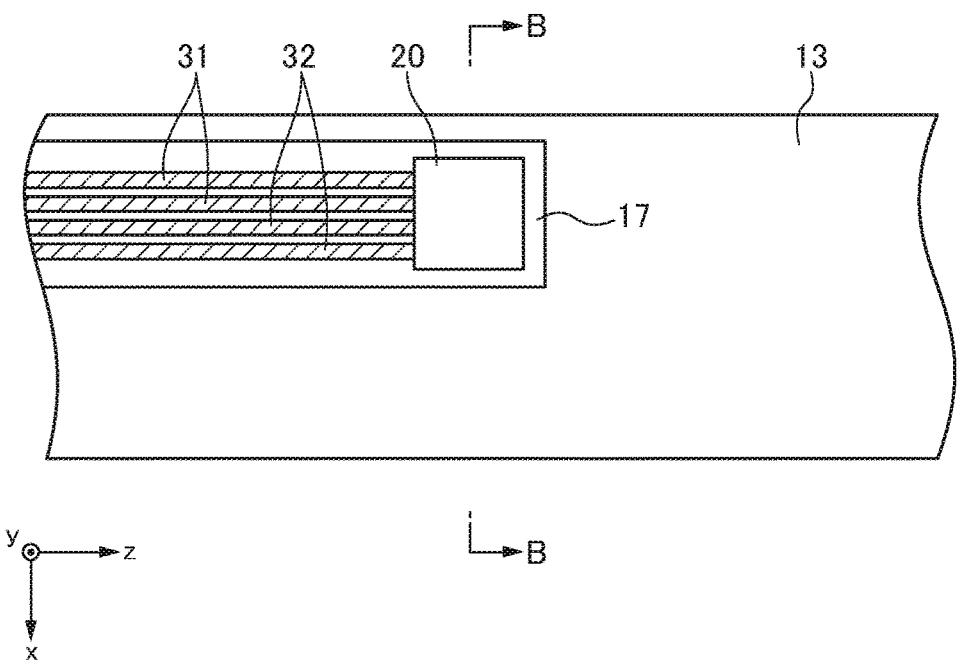
FIG. 7 is a partial plan view of the sensing part according to a modification.
Figure 8:
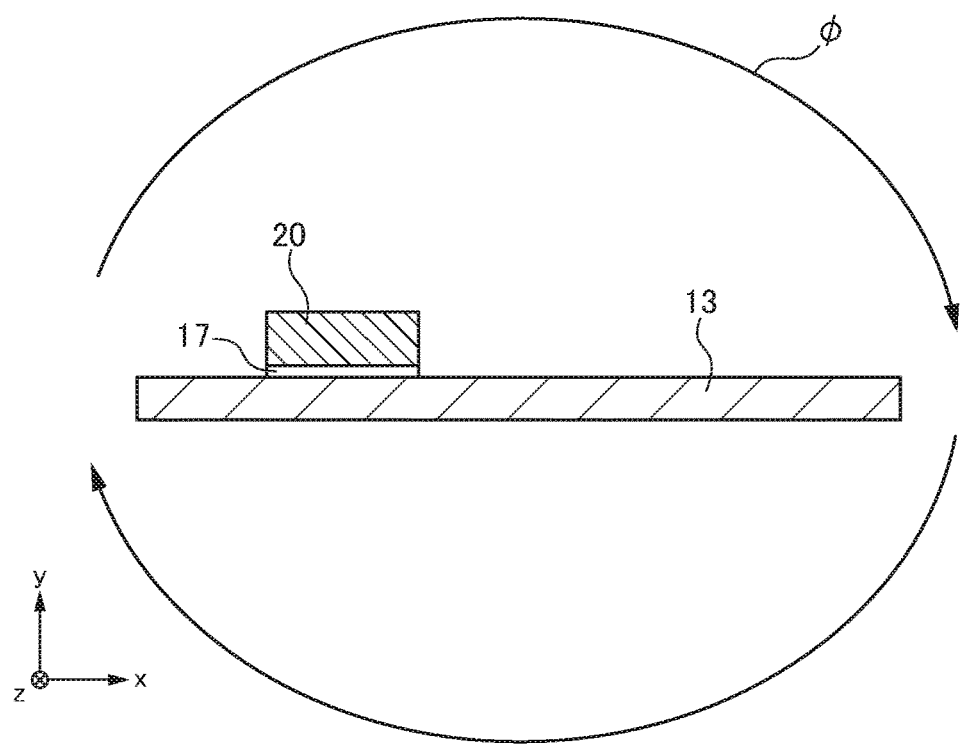
FIG. 8 is a schematic cross-sectional view taken along the line B-B in FIG. 7.

FIG. 7 is a partial plan view of the sensing part 13 according to a modification, and FIG. 8 is a schematic cross-sectional view taken along the line B-B in FIG. 7.

The example illustrated in FIGS. 7 and 8 differs from the example illustrated in FIGS. 5 and 6 in that no slit is formed in the sensing part 13. In this case, when part of the current I to be measured flows in the sensing part 13 in the z-direction, a magnetic field φ is generated around the sensing part 13 according to the right-handed screw rule. The magnetic field φ has an x-direction component with respect to the magnetic sensor 20, so that, by setting the magnetic sensing direction of the magnetic sensor 20 to the x-direction, it is possible to detect the strength of the magnetic field φ.

In the present embodiment, both the inner and outer shapes of the cylindrical structure part 11 are a true circle, and the thicknesses thereof are substantially constant in the circumferential direction. Thus, the current density of the current flowing in the cylindrical structure part 11 in the positive z-direction is substantially uniform in the circumferential direction. As a result, in the hollow area 10a surrounded by the cylindrical structure part 11, the magnetic field generated by the current flowing in the cylindrical structure part 11 is cancelled substantially completely. That is, the hollow area 10a becomes a zero magnetic field area where substantially no magnetic field is generated due to the current flowing in the cylindrical structure part 11. In the current sensor 1 according to the present embodiment, the sensing part 13 and magnetic sensor 20 are disposed in the thus formed hollow area 10a, so that a magnetic field to be applied to the magnetic sensor 20 is substantially only a magnetic field due to the current flowing in the sensing part 13. This allows the magnetic sensor 20 to selectively detect the magnetic field generated due to the current flowing in the sensing part 13.

In the present embodiment, the cylindrical structure parts 11 and 12 are coaxially arranged, and the directions of the current flowing in the cylindrical structure part 11 and current flowing in the cylindrical structure part 12 are opposite to each other, so that the magnetic field generated from the cylindrical structure part 11 and that generated from the cylindrical structure part 12 cancel each other, whereby most of the magnetic field to be radiated outside is eliminated. This significantly reduces the inductance of the bus bar 10. In particular, when the amount of current flowing in the cylindrical structure part 11 and that flowing in the cylindrical structure part 12 are the same, a magnetic field exists only inside the insulating film 19 in theory. However, in the present embodiment, the sum of the current flowing in the cylindrical structure part 11 and current flowing in the sensing part 13 flows in the cylindrical structure part 12, and thus the amount of current flowing in the cylindrical structure part 11 and that flowing in the cylindrical structure part 12 do not coincide with each other. However, by reducing a current component flowing in the sensing part 13, it is possible to further reduce a magnetic field to be radiated outside.

Assuming that the diameters of the cylindrical structure parts 11 and 12 are A and B, respectively, and that the length of the cylindrical structure parts 11 and 12 in the z-direction is C, an inductance L of the cylindrical structure parts 11 and 12 is represented by the following expression:

$$L=(\mu_0 C/2\pi)\ln(B/A)$$

Where $\mu_0$ is the permeability of air.

Thus, when the difference between the diameter A of the cylindrical structure part 11 and diameter B of the cylindrical structure part 12 is small, the inductance L becomes significantly small. This enhances the responsiveness of the magnetic sensor 20 with respect to a change in the current I to be measured, so that even when the current to be measured changes into a pulse on the order of μsec, it is possible to reduce measurement error.

When the cylindrical structure part is not configured to be a double-cylindrical structure as in the present embodiment but configured to be a single-cylindrical structure, a magnetic field enters the hollow area 10a from the end portion thereof in the z-direction, so that, in order to reliably dispose the magnetic sensor 20 in a zero magnetic field area, it is necessary to increase the length of the cylindrical structure part in the z-direction. On the other hand, the cylindrical structure part according to the present embodiment has a double-cylindrical structure, and thus the amount of the magnetic field to be radiated outside is significantly small, so that only a small amount of the magnetic field enters the hollow area 10a from the end portion thereof in the z-direction. This makes most of the hollow area 10a be a zero magnetic field area, allowing a reduction in the length of the cylindrical structure parts 11 and 12 in the z-direction. The reduction in the length of the cylindrical structure parts 11 and 12 in the z-direction leads to not only a reduction in the entire size of the current sensor 1 but also a further reduction in the inductance L of the cylindrical structure parts 11 and 12.

Figure 9:
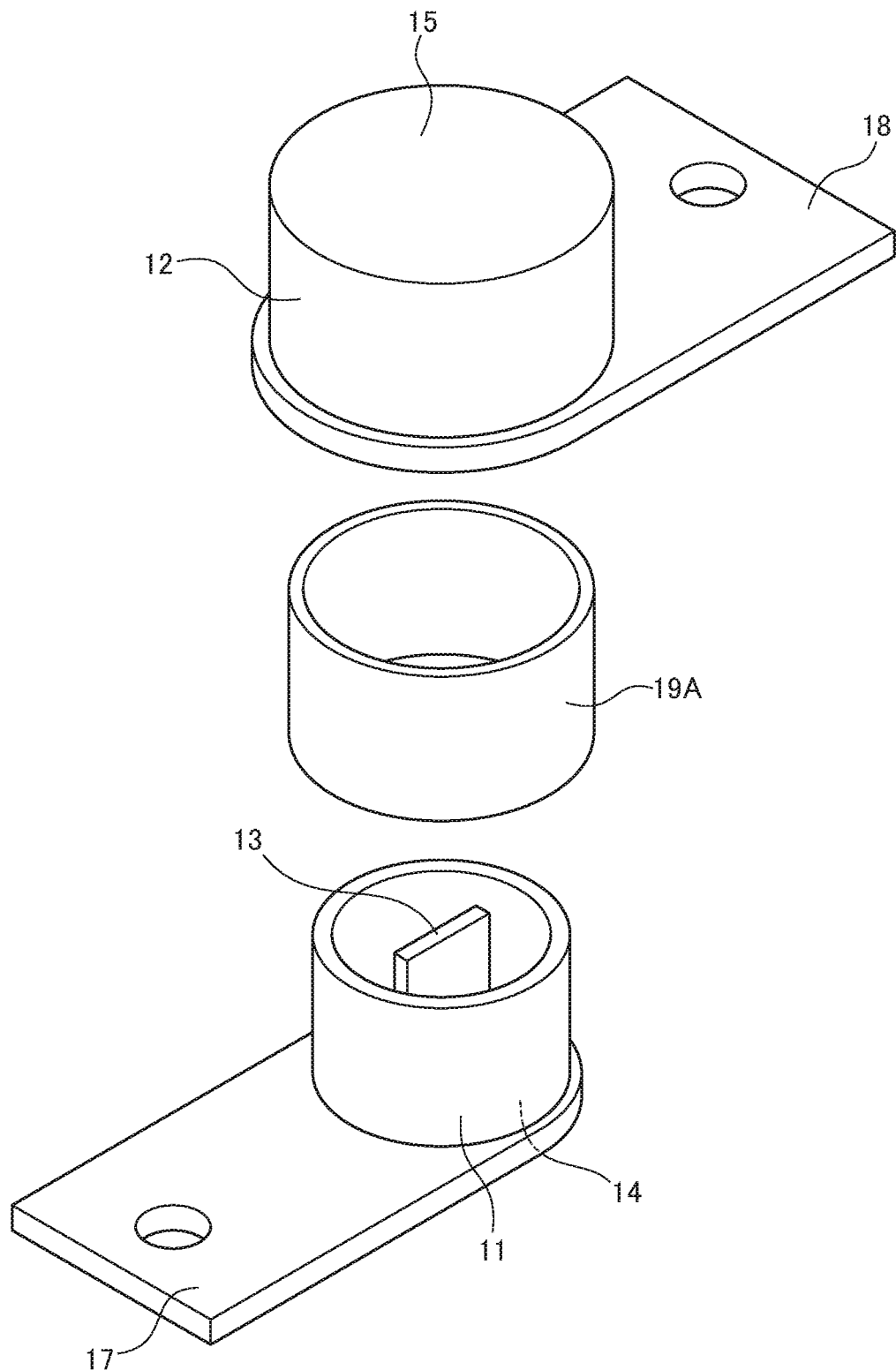
FIG. 9 is a schematic exploded perspective view illustrating a bus bar according to a modification.
Figure 10:
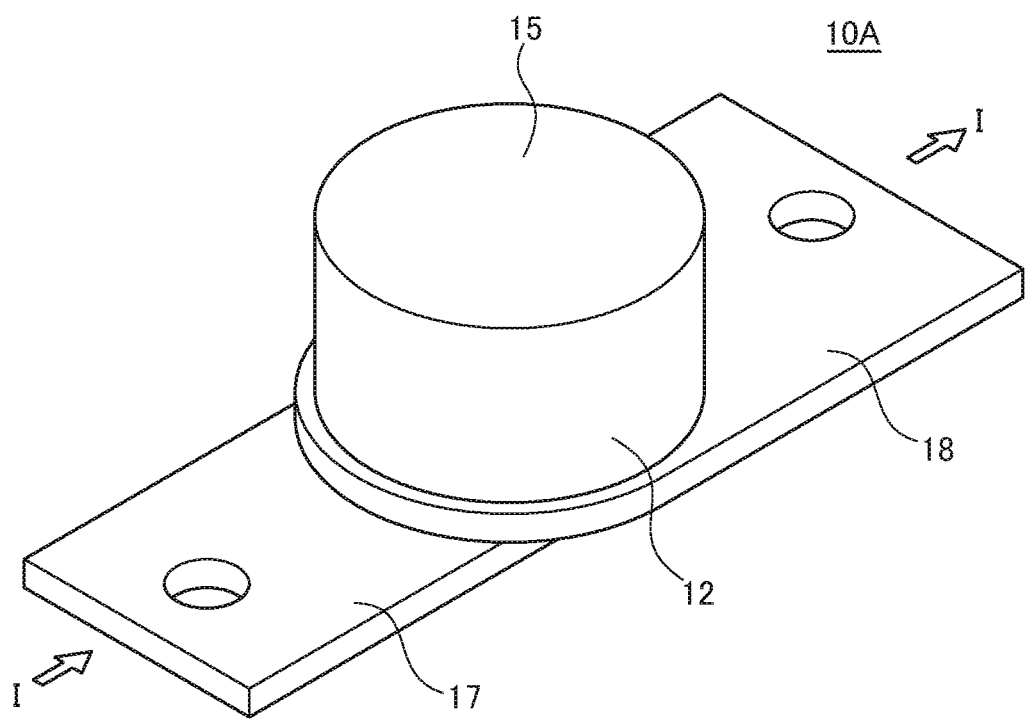
FIG. 10 is a schematic perspective view illustrating the bus bar according to a modification in assembled state.

In the above-described bus bar 10, the cylindrical structure parts 11 and 12 are constituted as a single integrated member; however, this is not essential in the present invention, but they may be separated members. For example, a configuration like a bus bar 10A illustrated in FIG. 9 may be possible. That is, the cylindrical structure parts 11 and 12 are prepared as separated members and are then integrated as illustrated in FIG. 10 by inserting the cylindrical structure part 11 into the cylindrical structure part 12 through a cylindrical insulating member 19A. When the cylindrical structure parts 11 and 12 are thus detachably configured, the bus bar 10A can be easily manufactured.

It is apparent that the present invention is not limited to the above embodiments, but may be modified and changed without departing from the scope and spirit of the invention.

For example, in the above embodiment, the current I to be measured is branched into the inner side cylindrical structure part 11 and sensing part 13, and then the current flowing in the cylindrical structure part 11 and current flowing in the sensing part 13 are merged at the outer side cylindrical structure part 12. Alternatively, conversely, the current I to be measured may be branched into the outer side cylindrical structure part 12 and sensing part 13, and then the current flowing in the cylindrical structure part 12 and current flowing in the sensing part 13 may be merged at the inner side cylindrical structure part 11.

Further, in the above embodiment, the entire current flowing in the cylindrical structure part 11 and sensing part 13 is made to flow in the cylindrical structure part 12; however, this is not essential in the present invention, but only part of the current flowing in the cylindrical structure part 11 and sensing part 13 may be made to flow in the cylindrical structure part 12.

What is claimed is:

1. A current sensor comprising:
    a bus bar including:
        first and second cylindrical structure parts which are coaxially arranged; and
        a sensing part disposed in a hollow area surrounded by the first and second cylindrical structure parts; and
    a magnetic sensor disposed in the hollow area,
    wherein the bus bar is configured to branch current to be measured into the first cylindrical structure part and sensing part and to make at least part of a current component of the current to be measured that flows in the first cylindrical structure part in one direction flow in the second cylindrical structure part in an opposite direction to the one direction,
    wherein the second cylindrical structure part is disposed outside the first cylindrical structure part,
    wherein one end of the sensing part in an axial direction thereof is connected to the first cylindrical structure part without being connected to the second cylindrical structure part, and
    wherein other end of the sensing part in the axial direction is connected to both the first and second cylindrical structure parts.

2. The current sensor as claimed in claim 1, wherein the first and second cylindrical structure parts are detachably configured.

* * * * *